(12) United States Patent
Koen et al.

(10) Patent No.: US 7,151,409 B2
(45) Date of Patent: Dec. 19, 2006

(54) PROGRAMMABLE LOW NOISE AMPLIFIER AND METHOD

(75) Inventors: Myron J. Koen, Tucson, AZ (US); Harish Venkataraman, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 10/899,497

(22) Filed: Jul. 26, 2004

(65) Prior Publication Data
US 2006/0017506 A1 Jan. 26, 2006

(51) Int. Cl.
*H03F 3/45* (2006.01)
(52) U.S. Cl. .................. 330/254; 330/278; 330/288; 330/51
(58) Field of Classification Search ............... 330/254, 330/278, 288, 51
See application file for complete search history.

(56) References Cited

U.S. PATENT DOCUMENTS

| | | | | |
|---|---|---|---|---|
| 6,049,252 A | * | 4/2000 | Iwata | ................. 330/254 |
| 6,069,866 A | * | 5/2000 | Pietruszynski et al. | 369/124.11 |
| 6,118,340 A | | 9/2000 | Koen | ................. 330/253 |
| 6,201,443 B1 | * | 3/2001 | Tanji | ................. 330/254 |
| 6,229,375 B1 | | 5/2001 | Koen | ................. 327/351 |
| 6,278,325 B1 | * | 8/2001 | Juang | ................. 330/285 |
| 6,888,406 B1 | * | 5/2005 | Ashby et al. | ................. 330/254 |

* cited by examiner

*Primary Examiner*—Patricia Nguyen
(74) *Attorney, Agent, or Firm*—W. James Brady, III; Frederick J. Telecky, Jr.

(57) ABSTRACT

A programmable gain low noise amplifier includes a tail current transistor (Q3) having a source coupled to a first reference voltage (VDD) and a drain coupled to a tail current conductor (18) and, in a differential input embodiment, a plurality of pairs (Q4,5, Q7,8, Q10,11, Q13,14) of differentially coupled input transistors. Each pair includes a first input transistor having a gate coupled to a first input conductor (19A) and a drain coupled to a first output conductor (26A) and a second input transistor having a gate coupled to a second input conductor (19B), a source coupled to a source of the first transistor, and a drain coupled to a second output conductor (26B). The sources of the first and second input transistors of some or all of the pairs are selectively coupled to the tail current conductor (18) in it response to corresponding gain control signals (B1,2,3).

7 Claims, 3 Drawing Sheets

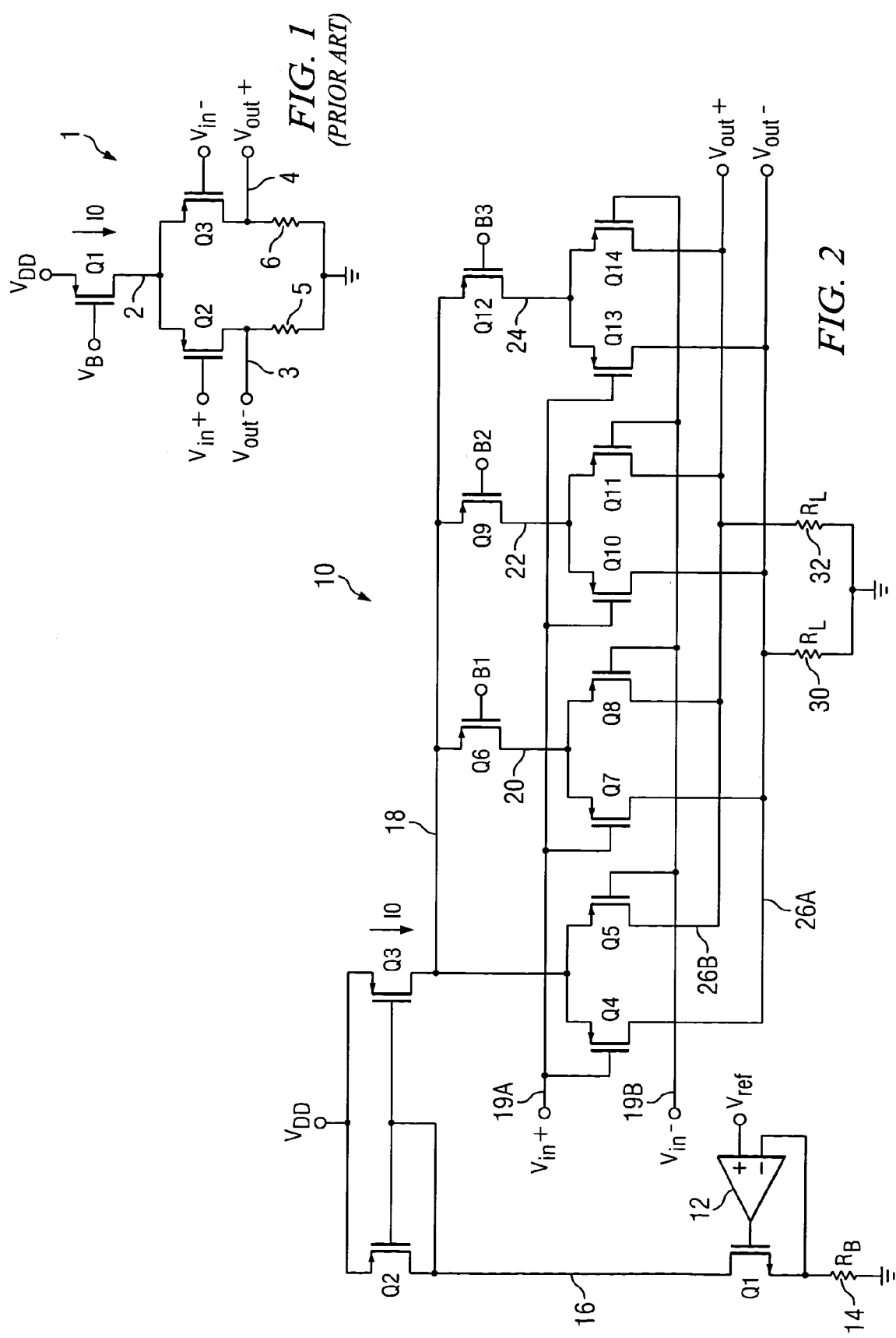

PROGRAMMABLE LOW NOISE AMPLIFIER AND METHOD

BACKGROUND OF THE INVENTION

The present invention relates generally to low noise amplifiers, and more particularly to low noise amplifiers having programmable gain.

By way of background, resistance in series between the source electrodes of a pair of differentially coupled MOSFETs is the main source of noise in a differential amplifier. The prior art circuit shown in FIG. 1 illustrates a very low noise differential amplifier 1 which includes a P-channel current source transistor Q1 having its drain connected directly by a conductor 2 to the sources of a pair of P-channel input transistors Q2 and Q3. The drains of input transistors Q2 and Q3 are connected by output conductors 3 and 4 to load resistors 5, and 6, which have a resistance RL. Input voltages Vin+ and Vin− are applied to the gates of input transistors Q2 and Q3, respectively, and output voltages Vout− and Vout+ are produced on output conductors 3 and 4, respectively. The reason that the noise of amplifier 1 is very low is that there is no resistor connected between the source electrodes of transistors Q1 and Q2.

The gain of amplifier 1 is given by $$\text{Gain} = Gm \times RL, \quad \text{Equation (1)}$$

where Gm is the transconductance of the pair of differentially connected input transistors Q2 and Q3 and is given by $$Gm = SQR\{\mu \cdot Cox \cdot (W/L) \cdot I\}, \quad \text{Equation (2)}$$

where SQR means the square root of the bracketed expression, $\mu$ is the mobility of majority carriers in the channel regions of input transistors Q2 and Q3, Cox is the capacitance formed by the gate and channel region of each of the input transistors Q2 and Q3, W/L is the channel-width-to-channel-length ratio of each of input transistors Q2 and Q3, and I is the current flowing through each of input transistors Q2 and Q3.

Prior art low noise amplifier 1 is somewhat non-linear and introduces distortion, which, however, is acceptable in some applications. If the distortion is not acceptable, it can be reduced in various ways, as explained in commonly owned U.S. Pat. No. 6,118,340 issued Sep. 12, 2000 to present inventor Koen.

Usually, the tail current I0 in current source transistor Q1 is constant, in order to enable amplifier 1 to achieve a particular output voltage swing. Consequently, the gain of prior art low noise amplifier 1 is not variable or programmable because the ratio W/L is fixed. However, there are many applications in which programmable gain of an amplifier is very desirable.

For systems that must process signals with an extremely wide dynamic range, such as ultrasound, with low distortion, it is often necessary to lower the gain of the input to the low noise amplifier. Being able to lower the amplifier gain by electronic means is also very desirable, as parasitic impedances are often developed when electrodes that might be used to adjust the gain are brought out to the edge of a semiconductor package. These parasitic impedances often cause the gain to be imprecise and can lead to circuit oscillation. By being able to lower the amplifier gain, a larger amplitude input signal can be handled, compared to the case where the amplifier is configured to have only high gain. The high gain setting is desirable to achieve the lowest noise but will result in "overload" from strong input signals. Allowing the gain to be reduced results in higher noise, but the amplifier can handle a larger amplitude input signal.

There are various known techniques for providing programmable gain amplifiers, some of which involve switching of gain resistors of various values into and/or out of connection between the sources of input transistors such as Q2 and Q3. Other prior programmable gain amplifiers utilize various techniques to controllably adjust or vary the resistance of gain resistors coupled between the sources of input transistors such as Q2 and Q3. Unfortunately, any resistance connected between the sources of input transistors Q2 and Q3 introduces noise, and therefore the prior programmable gain amplifiers of this kind inherently have relatively high noise compared to the noise of the basic prior art low noise amplifier 1 of FIG. 1. (The noise introduced by a resistance R coupled between the sources of differentially coupled input transistors such as Q2 and Q3 is approximately equal to the square root of $4 \cdot k \cdot T \cdot B \cdot R$, where k is Boltzmann's constant, T is the absolute temperature in degrees Kelvin, and B is the bandwidth.)

The prior techniques of using external switches to selectively switch external resistors so as to control the gain of an amplifier is costly and inconvenient because of the physical size, and also reduces circuit performance because of parasitic capacitances associated with the external resistor and switch.

Thus, there is an unmet need for a low noise programmable gain MOS amplifier.

There also is an unmet need for a low noise, programmable gain MOS or CMOS amplifier that can extend the dynamic range of signals which can be amplified with low distortion.

There also is an unmet need for a low noise, programmable gain MOS or CMOS amplifier that can extend the dynamic range of input signals which can be amplified with low distortion.

There also is an unmet need for a low noise, programmable gain CMOS or MOS amplifier which avoids the need for and costs associated with use of external gain control resistors and large amount of area required for the external gain control resistors on a printed circuit board.

There also is an unmet need for a way of controlling the gain of programmable gain amplifier with a minimum number of gain control signal conductors.

SUMMARY OF THE INVENTION

It is an object of the present invention to provide a low noise, programmable gain MOS amplifier.

It is another object of the invention to provide a low noise, programmable gain MOS or CMOS amplifier that can extend the dynamic range of input signals that can be amplified with low distortion.

It is another object of invention to provide a low noise, programmable gain MOS or CMOS amplifier that is electronically programmable with a single control signal, thereby eliminating parasitic impedances from affecting the amplifier gain.

It is another object of the invention to provide a low noise, programmable gain CMOS or MOS amplifier which avoids the need for and costs associated with use of an external gain control resistor and the associated amount of area required on a printed circuit board.

It is another object of invention to provide a low noise, low-cost programmable gain amplifier which achieves both low current noise and low voltage noise.

There also is an unmet need for a way of controlling the gain of programmable gain amplifier using a minimum number of gain control signal conductors.

Briefly described, and in accordance with one embodiment, the present invention provides a programmable gain low noise amplifier (10) including a tail current transistor (Q3) having a source coupled to a first reference voltage (VDD) and a drain coupled to a tail current conductor (18), a plurality of input transistors (Q4, Q7, Q10, Q13) each having a gate coupled to an input conductor (19A) and a drain coupled to an output conductor (26A). A plurality of switch transistors (Q6,9,12) selectively couple the sources of at least some of the input transistors to the tail current conductor (18) in response to a plurality of gain selection signals (B1,2,3), respectively. A load resistor (30) is coupled between the output conductor (26A) and a second reference voltage (GROUND).

In another embodiment, the invention provides a programmable gain low noise amplifier (10) including a tail current transistor (Q3) having a source coupled to a first reference voltage (VDD) and a drain coupled to a tail current conductor (18) and a plurality of pairs (Q4,5, Q7,8, Q10,11, Q13,14) of differentially coupled transistors, each pair including a first transistor having a gate coupled to a first input conductor (19A) and a drain coupled to a first output conductor (26A) and a second transistor having a gate coupled to a second input conductor (19B), a source coupled to a source of the first transistor, and a drain coupled to a second output conductor (26B). The sources of the first and second transistors of some or all of the pairs are coupled to the tail current conductor (18). In one described embodiment, a plurality of switch transistors (Q6,9,12) for coupling the sources of the first and second transistors of all but one of the pairs to the tail current conductor (18) in response to a plurality of selection signals (B1,2,3), respectively. A first load resistor (30) is coupled between the first output conductor (26A) and a second reference voltage (GROUND) and a second load resistor (32) is coupled between a second output conductor (26B) and the second reference voltage (GROUND).

In the foregoing embodiment as described, a channel-length-to-channel-width ratio of the first transistor in each pair is equal to a channel-length-to-channel-width ratio of the second transistor in that pair, wherein the channel-length-to-channel-width ratios of the first and second transistors are progressively larger in the pairs, respectively. The various switch transistors (Q6,9,12) couple the sources of the first and second transistors of all but a first (Q4,5) one of the pairs, respectively, to the tail current conductor (18), the sources of the first and second transistors of the first pair (Q4,5) being coupled directly to the tail current conductor (18).

In one embodiment, the various switch transistors (Q15, 6,9,12) couple the sources of the first and second transistors of all of the pairs, respectively, to the tail current conductor (18).

In the some described embodiments, the first transistors and second transistors are P-channel transistors, and the switch transistors also are P-channel transistors. The tail current transistor (Q3) is a P-channel transistor having a gate coupled to a gate and drain of a current mirror control transistor (Q2) having a source coupled to the first reference voltage (VDD). A bias control circuit includes an operational amplifier (12) having a first input coupled to a third reference voltage (Vref), an output coupled to a gate of a control transistor (Q1) having a drain coupled to the gate and a drain of the current mirror control transistor (Q2) and a source coupled to a second input of the operational amplifier (12) and a first terminal of a control resistor (14) having a second terminal coupled to the second control voltage (GROUND). The control resistor (14) is composed of the same resistive material as the first (30) and second (32) load resistors, so that accurate tracking of the tail current (I) with respect to temperature and process variations is achieved. A gain select circuit (35) operates in response to a gain select input (36) to produce the desired gain selection signals on the gates of the plurality of switch transistors, respectively.

BRIEF DESCRIPTION OF THE DRAWINGS

FIG. 1 is a schematic diagram of a basic prior art low noise MOS amplifier.

FIG. 2 is a schematic diagram of a programmable gain low noise amplifier of the present invention.

DETAILED DESCRIPTION OF THE PREFERRED EMBODIMENTS

Figure 3:
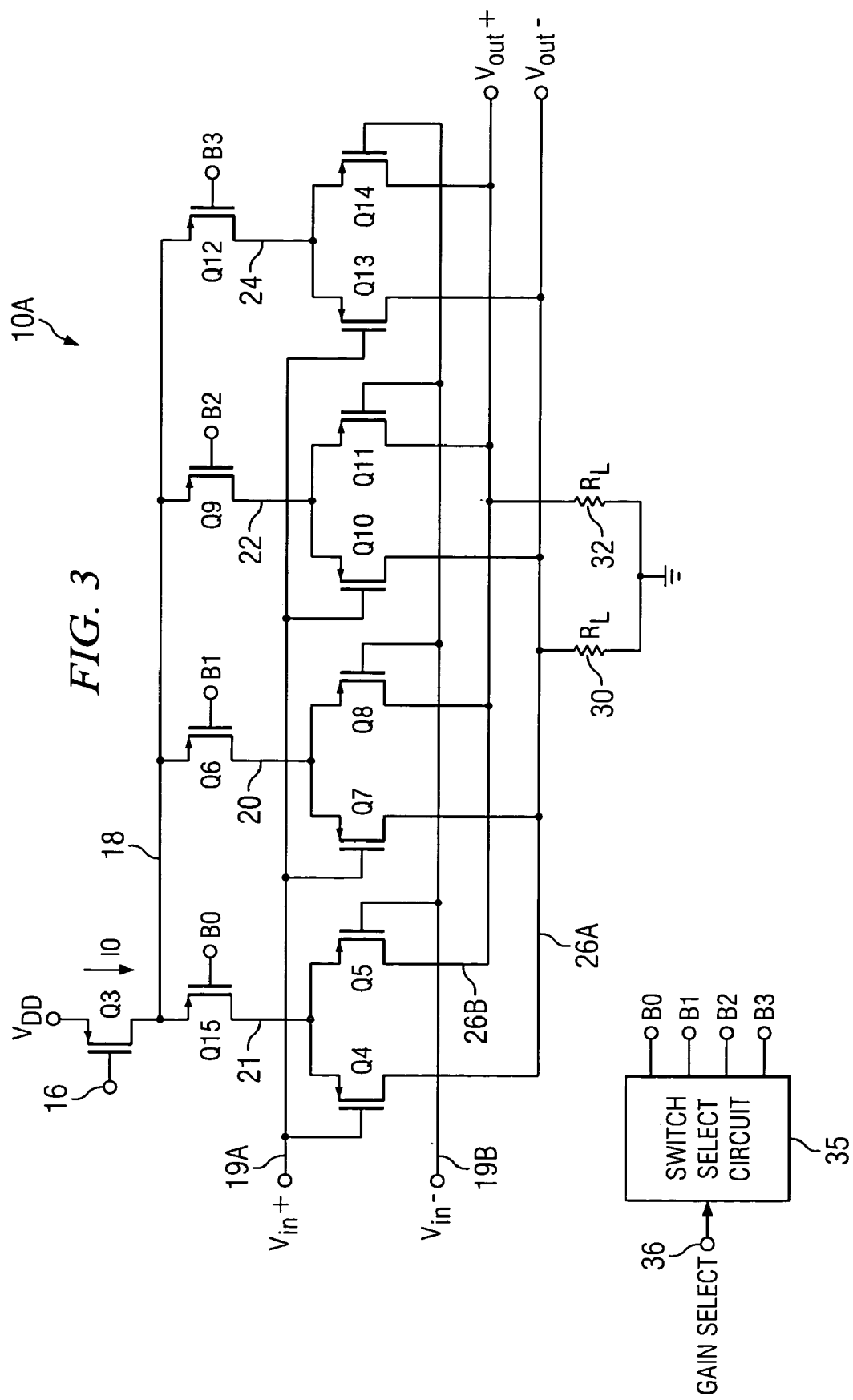
FIG. 3 is a schematic diagram of another embodiment of a programmable gain low noise amplifier of the present invention.

Referring to FIG. 2, low noise programmable differential amplifier 10 includes a bias circuit including an operational amplifier 12 having its (+) input coupled to a reference voltage Vref, its output connected to the gate of a N-channel transistor Q1, and its (−) input connected to the source of transistor Q1. A resistor 14 having a resistance RB is connected between ground and the source of transistor Q1. The drain of transistor Q1 is connected by conductor 16 to the drain of a P-channel current mirror control transistor Q2 and to the gates of transistor Q2 and a P-channel current mirror output transistor Q3, referred to herein as tail current transistor Q3. A tail current I0 flows through tail current transistor Q3 by virtue of the operation of the above mentioned bias circuit and transistor Q2 to achieve tracking of tail current I0 width respect to temperature and processing parameters associated with control resistor 14 and subsequently mentioned load resistors 30 and 32. The sources of transistors Q2 and Q3 are connected to VDD. The drain of transistor Q3 is connected by tail current conductor 18 to the sources of P-channel input transistors Q4 and Q5 and the sources of switch transistors Q6, Q9 and Q12.

Transistors Q4 and Q5 constitute a "differentially coupled pair" of input transistors. The gate of input transistor Q4 is connected to an input voltage Vin+ by means of input conductor 19A, and the gate of input transistor Q5 is connected to an input voltage Vin− by means of input conductor 19B. The drain of input transistor Q4 is connected to an output conductor 26A on which an output voltage Vout− is produced, and the drain of input transistor Q5 is connected to a conductor 26B, on which an output signal Vout+ channel is produced. (The term "differentially coupled transistors" as used herein is intended to encompass a pair of transistors having their sources connected or coupled together and responding to a differential signal applied between their gates, as shown for the input transistors in FIGS. 1 and 2. However, the term "differentially coupled transistors" also is intended to encompass a pair of transistors having their gates connected together and responding to a differential signal applied between their sources.)

Switch transistors Q6, Q9 and Q12 function as switch transistors, the gates of which are connected to gain selection signals B1, B2 and B3, respectively. The drain of switch transistor Q6 is connected by conductor 20 to the sources of a differentially connected pair of input transistors Q7 and Q8, the drains of which are connected to output conductors 26A and 26B, respectively. The gates of input transistors Q7 and Q8 are connected to Vin+ and Vin−, respectively.

Similarly, the drain of switch transistor Q9 is connected by conductor 22 to the sources of a differentially connected pair of input transistors Q10 and Q11, the drains of which are connected to output conductors 26A and 26B, respectively. The gates of input transistors Q10 and Q11 are connected to Vin+ and Vin−, respectively. Similarly, the drain of switch transistor Q12 is connected by conductor 24 to the sources of a differentially connected pair of input transistors Q13 and Q14, the drains of which are connected to output conductors 26A and 26B, respectively. The gates of input transistors Q13 and Q14 are connected to Vin+ and Vin−, respectively.

The W/L ratios (channel-width-to-channel-length ratios) of the input transistors of differential input transistor pairs Q4,5, Q7,8, Q10,11 and Q13,14 become progressively larger in that order. For example, exemplary values of the W/L ratios of the input transistors of differential input transistor pairs Q4,5, Q7,8, Q10,11 and Q13,14 can be 180/0.5, 800/0.5, 4200/0.5 and 16,000/0.5 for the transistors of differential input transistor pairs Q4,5, Q7,8, Q10,11 and Q13,14, respectively. (The indicated W and L values indicated in the above ratios are in microns.) When all of switch transistors Q6, Q9 and Q12 are off, all of the tail current I0 from current source transistor Q3 flows into the sources of input transistors Q4 and Q5. The resulting gain of low noise programmable amplifier can be accurately determined from Equations (1) and (2).

Then, if switch transistor Q6 is turned on, most of the tail current I0 flows through switch transistor Q6 and into the sources of transistors Q7 and Q8 because their input resistances are much lower than the source resistances of input transistors Q4 and Q5. If switch transistor Q6 then is turned off and switch transistor Q9 is turned on, even more of the tail current I0 flows through switch transistor Q9 and input transistors Q10 and Q11. Again, this is because their source resistances are much lower than the source resistances of input transistors Q4 and Q5. Finally, if switch transistor Q9 then is turned off and switch transistor Q12 is turned on, even more of the tail current I0 flows through switch transistor Q12 and input transistors Q13 and Q14, again because their resistances are much lower than the resistances of input transistors Q4 and Q5.

Note that if the W/L ratios of all of the differential input transistors Q7,8, Q10,11 and Q13,14 all are substantially larger than the W/L ratios of input transistors Q4,5, then the four values of gain of low noise programmable amplifier 10, with switch transistors Q6, Q9 and Q12 all turned off and then with each of switch transistors Q6, Q9 and Q12 turned on one at a time, are fairly accurately determined by the above Equations (1) and (2). For the above-mentioned exemplary values of W/L, the values determined by Equations (1) and (2) for a particular integrated circuit manufacturing process are indicated in the following table:

| W/L | Gain (dB) |
| --- | --- |
| 180/.5 | 6 |
| 800/.5 | 14 |
| 4200/.5 | 20 |
| 16,000/.5 | 23 |

Note that while four different differential pairs of input transistors are shown in FIG. 1, any suitable number of differential pairs of input transistors can be provided, limited mainly by loading effects that would tend to lower the amplifier bandwidth. (What is meant by "loading effects" is that as more differential pairs of input transistors are connected in parallel, more parasitic capacitance will be accumulated on conductors 26A and 26B, and that reduces the amplifier bandwidth.)

Output conductor 26A is connected to a first terminal of a load resistor 30 having a resistance RL, and output conductor 26B is connected to a first terminal of another load resistor 32 also having a resistance RL. The second terminals of load resistors 30 and 32 are connected to ground. Control resistor 14 of the above mentioned bias circuit is preferably composed of the same material as load resistors 30 and 32, so the bias circuit causes tail current I0 to appropriately track any temperature changes in load resistors 30 and 32 and to also track process parameters associated with the resistor material.

In operation, transistors Q6, Q9 and Q12 are operated as switches to selectively connect the drain of tail current transistor Q3 to a selected one of differential input transistor pairs Q7,8, Q10,11, or Q13,14. For example, when gain selection signal B1 is at ground, gain selection signals B2 and B3 then are connected to VDD and only switch transistor Q6 is turned on.

It should be appreciated that for many CMOS manufacturing processes, the available resistor materials produce resistor values which are only moderately accurate over ordinary manufacturing process variations and circuit operating temperature variations. The bias circuit including operational amplifier 12, transistor Q1 and resistor 14 reduces the temperature variations referred to, because operational amplifier 12 operates to apply the reference voltage Vref across resistor 14, which is composed of the same material as load resistors 30 and 32. The resulting current flows through transistor Q1 and current mirror control transistor Q2, and is mirrored (and also scaled, if desired) to cause current mirror output transistor Q3 to produce a value of tail current I0 which closely tracks the temperature and the sheet resistance of load resistors 30 and 32.

If the current I is independently set, then Gain is obtained by simply substituting Equation (2) into Equation (1) to obtain $$\text{Gain} = SQR\{\mu \cdot \text{Cox} \cdot (W/L) \cdot I\} \cdot RL. \qquad \text{Equation (3)}$$

This means that Gain is directly proportional to the value of the load resistances RL. If the load resistance RL varies, the value of Gain will vary in the same proportion.

However, if the tail current I0, and hence I, is determined by the bias circuit shown in FIG. 2, for example if $$I = Vref/RB, \qquad \text{Equation (4)}$$

then gm is obtained by simply substituting Equation (4) into Equation (2) to obtain $$gm = SQR\{\mu \cdot \text{Cox} \cdot (W/L) \cdot (Vref/RB)\}. \qquad \text{Equation (5)}$$

Substituting Equation (5) into Equation (1) results in $$\text{Gain} = SQR\{\mu \cdot C_{ox} \cdot (W/L) \cdot (V_{ref}/RB)\} \cdot RL. \quad \text{Equation (6)}$$

Assuming that control resistor 14 (of resistance RB) and load resistors 30 and 32 (of resistance RL) are composed of the same material, then RB in Equation (6) can be replaced by K·RL, where K is a constant ratio of RB 2 RL, resulting in $$\text{Gain} = SQR\{\mu \cdot C_{ox} \cdot (W/L) \cdot (V_{ref}/K \cdot RL)\} \cdot RL, \quad \text{Equation (7)}$$

which can be simplified to $$\text{Gain} = SQR\{\mu \cdot C_{ox} \cdot (W/L) \cdot (V_{ref}/K)\} \cdot SQR\{RL\}. \quad \text{Equation (8)}$$

This means that the dependence of Gain with respect to RL has been reduced. Instead of Gain being directly dependent on the value of RL, it is dependent on the square root of load resistance RL, which is a lower level of dependency. So, for example, if RL varies by 10 percent, Gain would vary by 4.88 percent.

FIG. 3 shows another embodiment of the invention in which all of the differential input transistor pairs, including transistor pair Q4,5, are coupled to tail current conductor 18 means of switch transistors. The circuitry in FIG. 3 is similar to that in FIG. 2 except that an additional switch transistor Q15 has its source connected to tail current conductor 18, its gate coupled to a gain select signal B0, and its drain connected by conductor 21 to the sources of input transistors Q4 and Q5. A switch select circuit 35 operates in response to the signal GAIN SELECT on a gain control input 36 to produce the desired switch select signals B0, B1, B2 and B3 on the gates of switch transistors Q15, Q6, Q9 and Q12, respectively. The signal GAIN SELECT can be in the form of a digital code which is decoded by switch select circuit 35 to produce the desired switch select signal (or combination of switch select signals) needed to turned on the switch transistor (or combination of switch transistors) needed to achieve the desired gain. Alternatively, the signal GAIN SELECT could be an analog voltage signal that switch select circuit 35 converts to a digital code which it then decodes to produce the desired switch select signal or signals. In any case, a workable implementation of switch select circuit 35 can be readily provided by those skilled in the art to provide the desired switch select signals in response to the gain control signal GAIN SELECT to obtain the desired amplifier gain. In some cases this provides the advantage of allowing control of programmable gain amplifier 10 by transmitting only a single analog control signal on a single conductor instead of a number of digital control signals on multiple conductors.

Ordinarily, switch select circuit 35 would turn on only one of switch transistors Q15, Q6, Q9 and Q12 at a time in order to select one of the four differential input transistor pairs, and hence one of the four above mentioned values of gain (i.e., 6, 14, 20, or 23) for programmable gain low noise amplifier 10A. However, in some cases it may be desirable to simultaneously turn on more than one of the switch transistors to achieve the desired gain.

Figure 4:
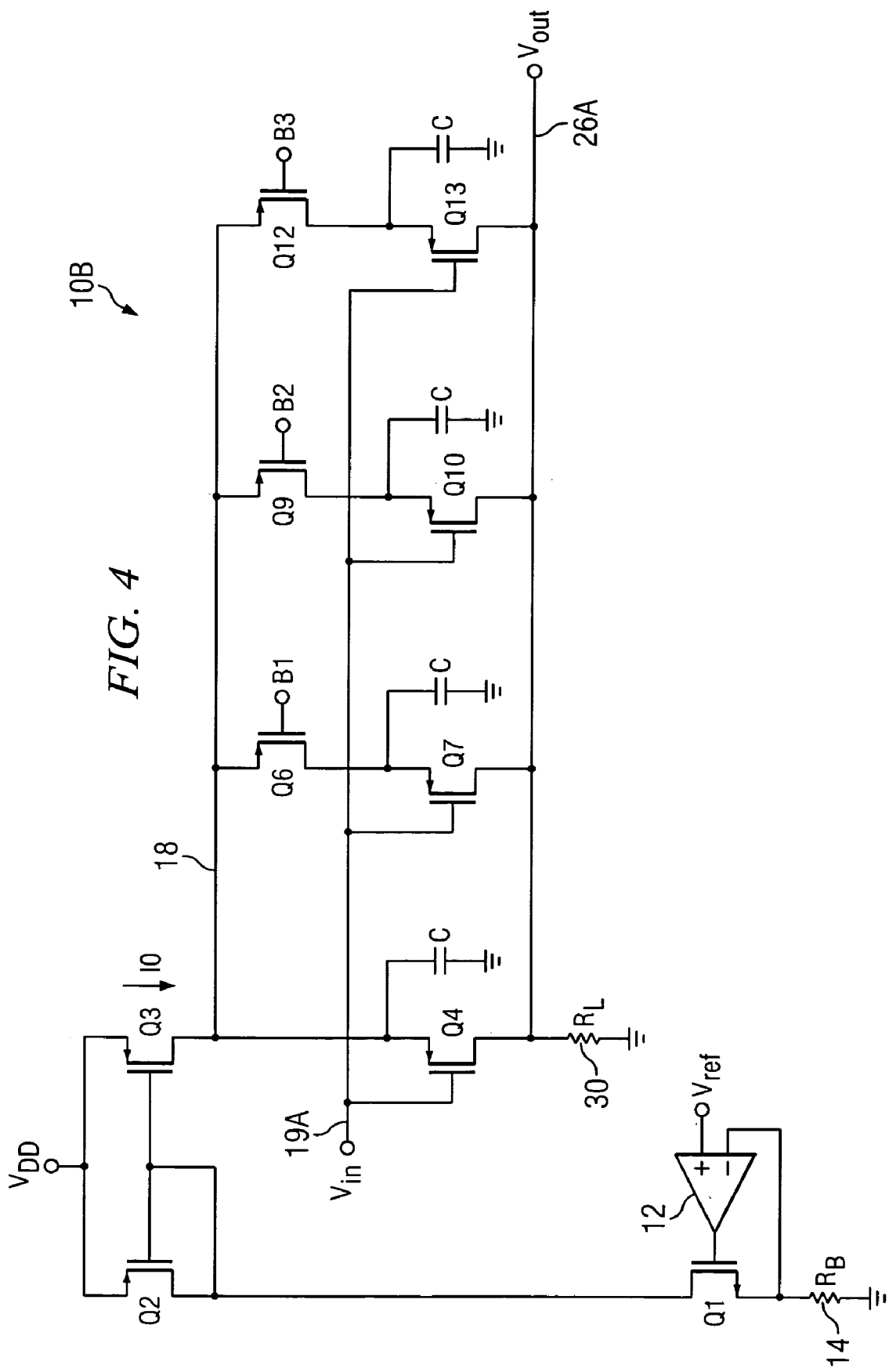
FIG. 4 is a schematic diagram of another programmable gain low noise amplifier of the present invention.

FIG. 4 shows another low noise, programmable gain amplifier 10B that is similar to to the one shown in FIG. 2, except only that a single-ended input signal Vin is provided. Vin is applied to input conductor 19A, and only a single-ended output signal Vout is produced. Vout is developed across a single load resistor 30 and is produced on conductor 26A. No differential input transistor pairs are provided, as input transistors Q5, Q8, Q11 and Q14 of FIG. 2 are omitted in FIG. 4. Bypass capacitors C are connected between ground and the sources of each of the input transistors, as shown. (Bypass capacitors are required to provide a low impedance have to ground for the sources of transistors Q1, Q7, Q10 and Q13. This is required because it is necessary for the sources of the various transistors to be referenced to AC ground in order to achieve gain.) This type of single-ended low noise, programmable gain amplifier might be useful in various RF applications.

The above described invention finally provides a practical, low-cost, low noise programmable gain voltage amplifier that is capable of meeting the above-mentioned need of the marketplace.

The described low noise, programmable gain MOS (or CMOS amplifier) can have an extended dynamic range of input signals that can be amplified with low distortion as a result of of being able to easily control the amplifier gain. The described low noise, programmable gain MOS or CMOS amplifier that is electronically programmable with a single analog control signal applied to an ADC (analog-to-digital converter), the digital outputs of which select the various switch transistors. The use of external gain resistors and switch transistors to control the gain is avoided, and improved amplifier performance is achieved by avoiding of of parasitic capacitances that would be associated with the external resistor and switches of the prior art programmable gain amplifiers. The gain of the described low noise programmable gain amplifier can be conveniently controlled by transmitting only a single analog control signal to an analog-to-digital converter which generates corresponding digital control signals applied to gates of the switch transistors.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the switch transistors and input transistors can be N-channel transistors.

What is claimed is:

1. A programmable gain low noise amplifier comprising:
    (a) a tail current transistor having a source coupled to a first reference voltage and a drain coupled to a tail current conductor;
    (b) a plurality of input transistors each having a gate coupled to an input conductor, a drain coupled to an output conductor, and a source coupled to the tail current conductor;
    (c) a plurality of switch transistors for selectively coupling the sources of at least some of the input transistors to the tail current conductor in response to a plurality of gain selection signals, respectively; and
    (d) a load resistor coupled between the output conductor and a second reference voltage,
    wherein the channel-length-to-channel-width ratios of the various input transistors are progressively larger.

2. A programmable gain low noise amplifier comprising:
    (a) a tail current transistor having a source coupled to a first reference voltage and a drain coupled to a tail current conductor;
    (b) a plurality of input transistors each having a gate coupled to an input conductor, a drain coupled to an output conductor, and a source coupled to the tail current conductor;
    (c) a plurality of switch transistors for selectively coupling the sources of at least some of the input transistors to the tail current conductor in response to a plurality of gain selection signals, respectively; and (d) a load resistor coupled between the output conductor and a second reference voltage, including a bias current control circuit including an operational amplifier having a first input coupled to a third reference voltage, an output coupled to a gate of a control transistor having a drain coupled to the gate and the drain of a current mirror control transistor and a source coupled to a second input of the operational amplifier and to a first terminal of a control resistor having a second terminal coupled to the second control voltage.

3. The programmable gain low noise amplifier of claim 2 wherein the control resistor is composed of the same resistive material as the load resistor so that accurate tracking of the tail current with respect to temperature and process variations is achieved.

4. A programmable gain low noise amplifier comprising:

(a) a tail current transistor having a source coupled to a first reference voltage and a drain coupled to a tail current conductor;

(b) a plurality of pairs of differentially coupled transistors, each pair including a first transistor having a gate coupled to a first input conductor and a drain coupled to a first output conductor and a second transistor having a gate coupled to a second input conductor, a source coupled to a source of the first transistor, and a drain coupled to a second output conductor, the sources of the first and second transistors of each pair being coupled to the tail current conductor;

(c) a plurality of switch transistors for coupling the sources of the first and second transistors of at least some of the pairs to the tail current conductor in response to a plurality of gain selection signals, respectively; and (d) a first load resistor coupled between the first output conductor and a second reference voltage and a second load resistor coupled between a second output conductor and the second reference voltage, wherein a channel-length-to-channel-width ratio of the first transistor in each pair is equal to a channel-length-to-channel-width ratio of the second transistor in that pair, and wherein the channel-length-to-channel-width ratios of the first and second transistors of the various pairs are progressively larger.

5. A programmable gain low noise amplifier comprising:

(a) a tail current transistor having a source coupled to a first reference voltage and a drain coupled to a tail current conductor;

(b) a plurality of pairs of differentially coupled transistors, each pair including a first transistor having a gate coupled to a first input conductor and a drain coupled to a first output conductor and a second transistor having a gate coupled to a second input conductor, a source coupled to a source of the first transistor, and a drain coupled to a second output conductor, the sources of the first and second transistors of each pair being coupled to the tail current conductor;

(c) a plurality of switch transistors for coupling the sources of the first and second transistors of at least some of the pairs to the tail current conductor in response to a plurality of gain selection signals, respectively; and (d) a first load resistor coupled between the first output conductor and a second reference voltage and a second load resistor coupled between a second output conductor and the second reference voltage, including a bias current control circuit including an operational amplifier having a first input coupled to a third reference voltage, an output coupled to a gate of a control transistor having a drain coupled to the gate and the drain of the current mirror control transistor and a source coupled to a second input of the operational amplifier and to a first terminal of a control resistor having a second terminal coupled to the second control voltage.

6. The programmable gain low noise amplifier of claim 5 wherein the control resistor is composed of the same resistive material as the first and second load resistors so that accurate tracking of the tail current with respect to temperature and process variations is achieved.

7. A method of providing programmable gain in a low noise amplifier, comprising:

(a) generating a tail current in a tail current transistor having a source coupled to a first reference voltage and a drain coupled to a tail current conductor;

(b) providing a plurality of input transistors each having a gate coupled to an input conductor and a drain coupled to a first output conductor; and (c) selectively coupling the sources of at least some of the input transistors to the tail current conductor in response to a plurality of gain selection signals, respectively, wherein step (b) includes providing a channel-length-to-channel-width ratio of the first transistor in each pair equal to a channel-length-to-channel-width ratio of the second transistor in that pair, and providing progressively larger channel-length-to-channel-width ratios of the first and second transistors of the various pairs.

* * * * *